United States Patent
Lee

(10) Patent No.: US 8,188,504 B2
(45) Date of Patent: May 29, 2012

(54) LIGHT-EMITTING DEVICE AND METHOD FOR MANUFACTURING THE SAME INCLUDING A LIGHT-EMITTING DEVICE AND A PROTECTION DEVICE ELECTRICALLY CONNECTED BY A CONNECTING LINE

(75) Inventor: Sang Youl Lee, Gwangju (KR)

(73) Assignee: LG Innotek Co., Ltd., Seoul (KR)

( * ) Notice: Subject to any disclaimer, the term of this patent is extended or adjusted under 35 U.S.C. 154(b) by 157 days.

(21) Appl. No.: 12/086,140

(22) PCT Filed: Mar. 22, 2007

(86) PCT No.: PCT/KR2007/001392
§ 371 (c)(1),
(2), (4) Date: Nov. 13, 2007

(87) PCT Pub. No.: WO2007/111436
PCT Pub. Date: Oct. 4, 2007

(65) Prior Publication Data
US 2010/0072504 A1    Mar. 25, 2010

(30) Foreign Application Priority Data
Mar. 26, 2006 (KR) .................. 10-2006-0027225

(51) Int. Cl.
*H01L 33/00* (2010.01)
(52) U.S. Cl. ..... 257/99; 257/79; 257/103; 257/E33.066; 257/E33.055; 438/23; 438/46
(58) Field of Classification Search ............... 257/99, 257/79, 103, E33.066, E33.055; 438/23, 438/46
See application file for complete search history.

(56) References Cited

U.S. PATENT DOCUMENTS

| | | | |
|---|---|---|---|
| 6,054,716 A | 4/2000 | Sonobe et al. | |
| 6,547,249 B2 | 4/2003 | Collins, III et al. | |
| 7,015,583 B2 * | 3/2006 | Ishii et al. | 257/772 |
| 7,341,880 B2 * | 3/2008 | Erchak et al. | 438/26 |
| 2002/0139987 A1 * | 10/2002 | Collins et al. | 257/88 |
| 2005/0167680 A1 * | 8/2005 | Shei et al. | 257/79 |
| 2005/0179042 A1 * | 8/2005 | Yang et al. | 257/84 |
| 2005/0274956 A1 | 12/2005 | Bhat | |
| 2006/0163604 A1 * | 7/2006 | Shin et al. | 257/103 |

FOREIGN PATENT DOCUMENTS

| | | |
|---|---|---|
| JP | 10-200159 A | 7/1998 |
| JP | 2003-243701 A | 8/2003 |
| JP | 2005-340849 A | 12/2005 |
| KR | 10-2005-0076680 | 7/2005 |
| WO | WO 2006004337 * | 1/2006 |

* cited by examiner

*Primary Examiner* — Marc Armand
(74) *Attorney, Agent, or Firm* — Birch, Stewart, Kolasch & Birch, LLP

(57) ABSTRACT

Provided are a light-emitting device and a method for manufacturing the same. The light-emitting device includes a substrate, a light-emitting device, a protection device, and a connecting line. The light-emitting device is formed on one part of the substrate, and includes a first semiconductor layer and a second semiconductor layer. The protection device is formed on another part of the substrate, and includes a fourth semiconductor layer and a fifth semiconductor layer. The connecting line electrically connects the light-emitting device and the protection device.

3 Claims, 3 Drawing Sheets

[Fig. 1]
(Related Art)
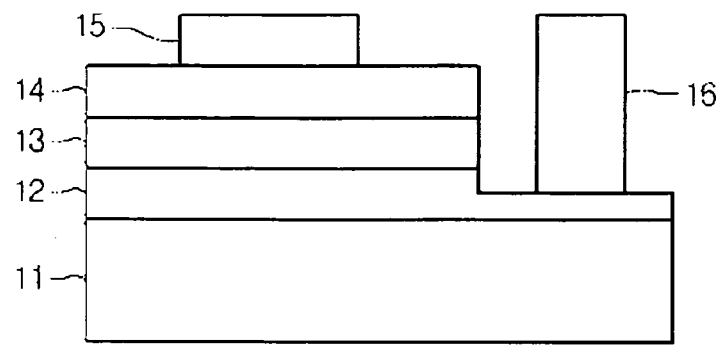
[Fig. 2]
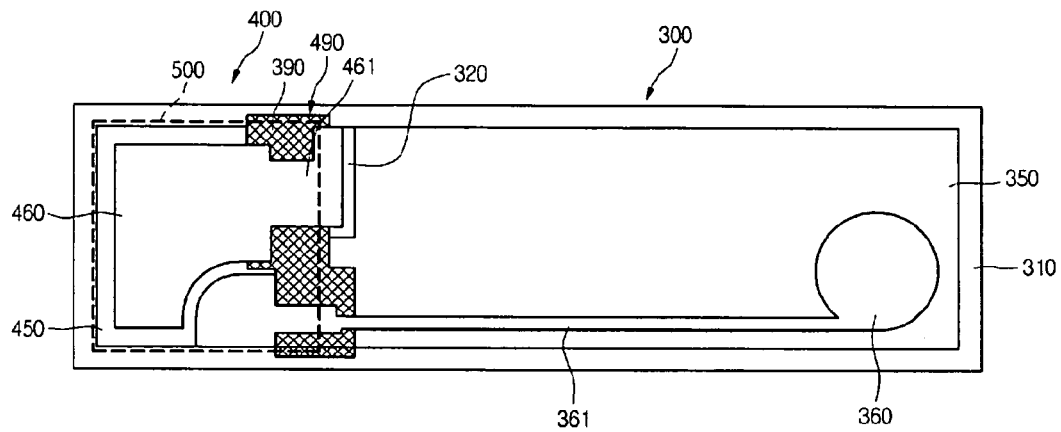
[Fig. 3]
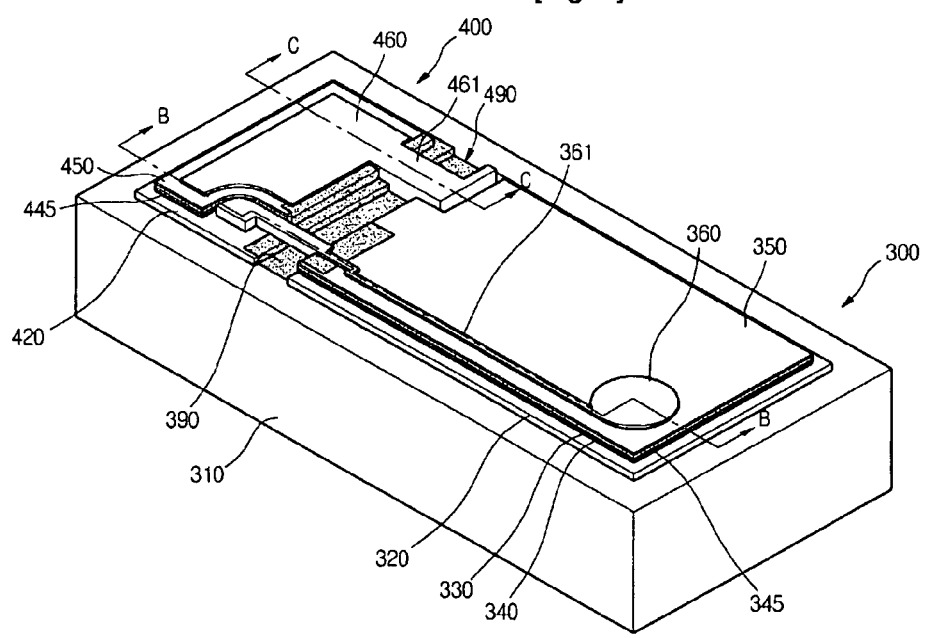

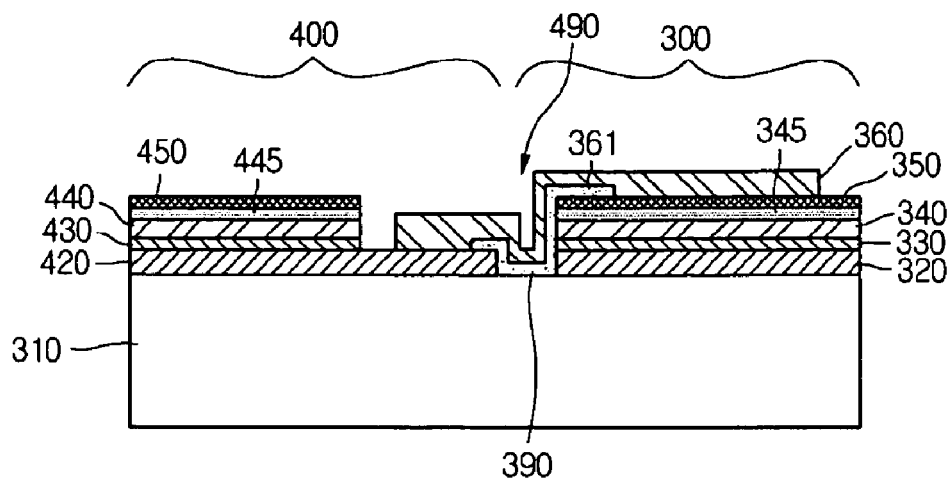
[Fig. 4]
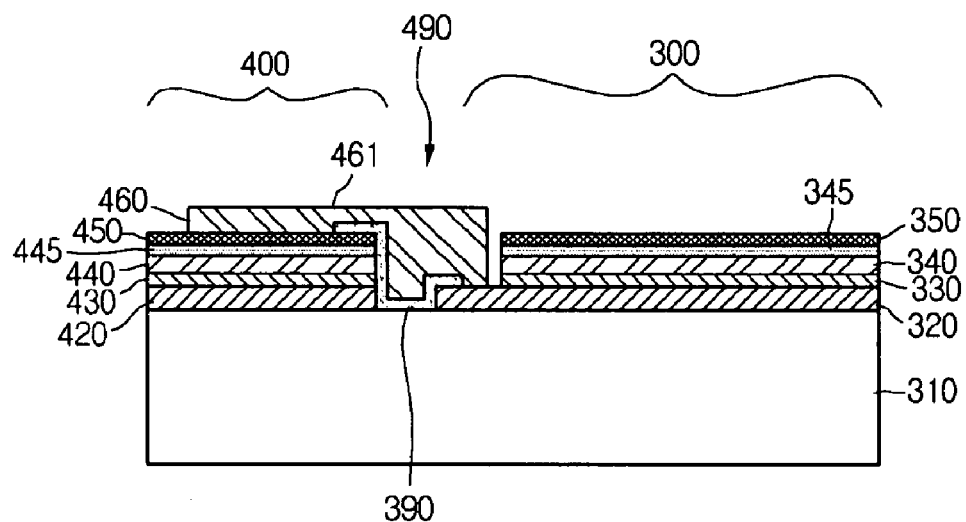
[Fig. 5]
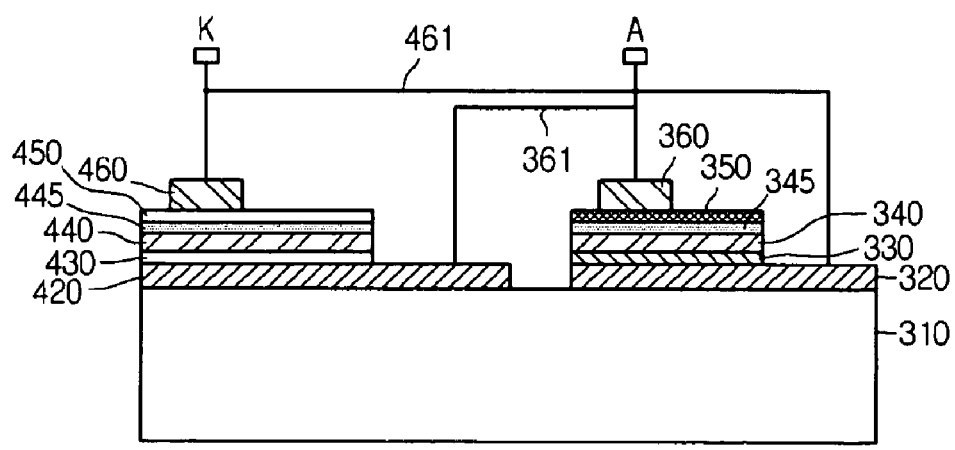
[Fig. 6]

[Fig. 7]
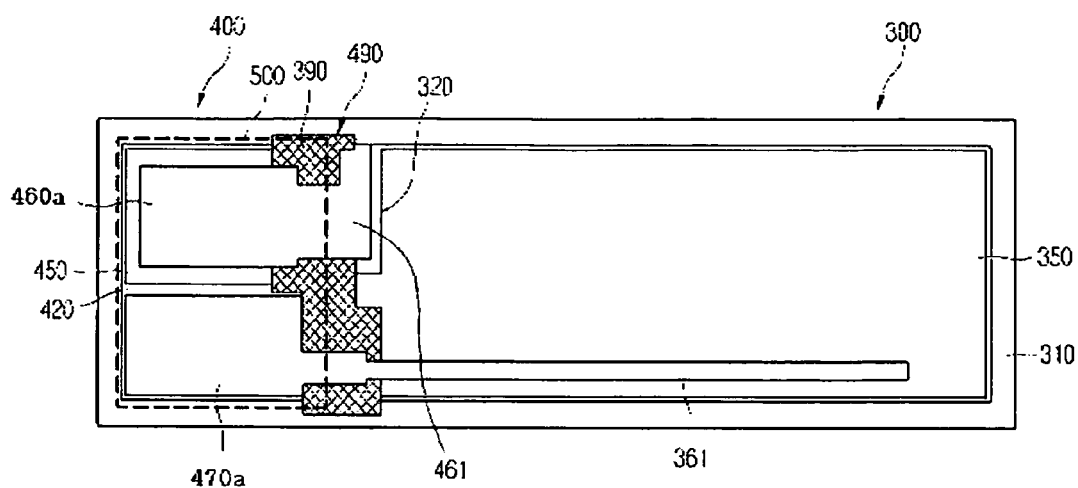
[Fig. 8]
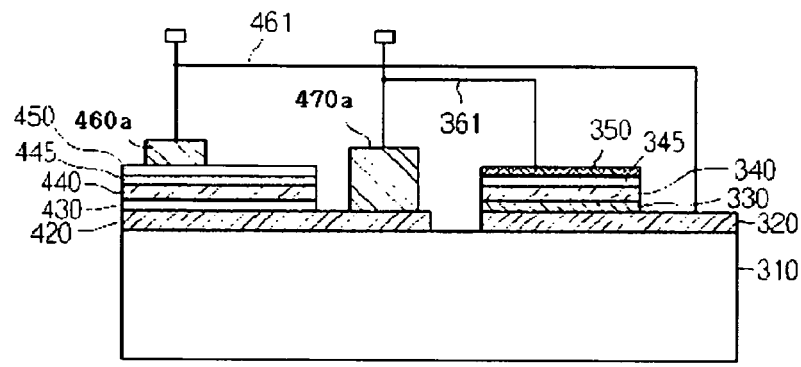

LIGHT-EMITTING DEVICE AND METHOD FOR MANUFACTURING THE SAME INCLUDING A LIGHT-EMITTING DEVICE AND A PROTECTION DEVICE ELECTRICALLY CONNECTED BY A CONNECTING LINE

TECHNICAL FIELD

The embodiment of present invention relates to a light-emitting device and a method for manufacturing the same.

BACKGROUND ART

*2Recently, a nitride semiconductor such as gallium nitride (GaN) is in the limelight as an important material for an electronic device and a photoelectric material because of its superior physical and chemical characteristics. Particularly, the development of highly efficient light-emitting diodes (LEDs) of primary colors (Red, Blue, Green) and white color expands an application area of a light-emitting diode. For example, the LED has been applied to a variety of fields such as a keypad, a backlight of a liquid crystal display device, a traffic light, a guide light of a runway in an airport and a lighting apparatus.

FIG. 1 is a sectional view illustrating a related art light-emitting device. The related art light-emitting device includes a sequentially formed an n-type GaN layer 12, an active layer 13, and a p-type GaN layer 14. Portions of the p-type GaN layer 14, the active layer 13, and the n-type GaN layer 12 are removed using etching to expose a portion of an upper surface of the n-type GaN layer 12. A p-type electrode 15 is formed on an upper surface of the p-type GaN layer 14 and an n-type electrode 16 is formed on the exposed upper surface of the n-type GaN layer 12.

The above described light-emitting device is applied to a variety of fields as a highly efficient light source. However, the related art light-emitting device is very susceptible to an electric shock such as a static electricity. In other words, an electrostatic discharge (ESD) generated in reverse bias in the light-emitting device may damage an internal physical structure of the light-emitting device.

In addition, because the related art ESD-protection device occupies a relatively large area, light efficiency of the light-emitting device is decreased.

Furthermore, because the addition of the ESD-protection device increases a size of the light-emitting device, it is difficult to apply the light-emitting device to a subminiature, ultra-thin and ultra-lightweight package.

DISCLOSURE

Technical Problem

An embodiment of the present invention provides a light-emitting device and a method for manufacturing the same that substantially obviates one or more of the problems due to limitations and disadvantages of the related art.

Another embodiment of the present invention provides a light-emitting device including an electrostatic discharge protection device for protecting the device from electrostatic discharge (ESD) applied thereto in reverse bias and a method for manufacturing the same.

Further another embodiment of the present invention provides a light-emitting device of high light efficiency by forming at least one bonding pad in an ESD-protection device and a method for manufacturing the same.

Also, another embodiment of the present invention provides a light-emitting device that includes an ESD-protection device and can be applied to a subminiature, ultra-thin and ultra-lightweight package, and a method for manufacturing the same.

Technical Solution

In one embodiment of the present invention provides a light-emitting device, comprising: a substrate; a light-emitting device on one part of the substrate, the light-emitting device having a first semiconductor layer and a second semiconductor layer; a protection device on another part of the substrate, the protection device having a fourth semiconductor layer and a fifth semiconductor layer; and a connecting line for electrically connecting the light-emitting device and the protection device.

In another embodiment of the present invention provides a light-emitting device comprising: a substrate; a light-emitting device on one part of the substrate, the light-emitting device having a first, a second and a third semiconductor layer; a protection device on another part of the substrate, the protection device having a fourth, a fifth and a sixth semiconductor layer; and a connecting line for electrically connecting the light-emitting device and the protection device.

In further another embodiment of the present invention provides a method for manufacturing a light-emitting device, the method comprising: forming a light-emitting device with a first semiconductor layer and a second semiconductor layer on one part of the substrate; forming a protection device with a fourth semiconductor layer and a fifth semiconductor layer on another part of the substrate; and forming a connecting line for electrically connecting the light-emitting device and the protection device.

ADVANTAGEOUS EFFECTS

According to embodiments of the present invention, it is possible to provide a light-emitting device that has an electrostatic discharge (ESD) protection characteristic, and thus can be applied to a light emitting diode package products requiring a high ESD characteristic.

According to embodiments of the present invention, it is also possible to provide a light-emitting device having a high ESD-protection characteristic without light efficiency reduction by forming at least one bonding pad in a protection device.

According to embodiments of the present invention, it is also possible to provide a light-emitting diode that includes an ESD-protection device therein and can be applied to a subminiature, ultra-thin and ultra-lightweight package, and thus can be applied to a variety of package products.

DESCRIPTION OF DRAWINGS

FIG. 1 is a sectional view illustrating a related art light-emitting device;

FIG. 2 is a plan view illustrating a light-emitting device according to a first embodiment of the present invention;

FIG. 3 is a perspective view illustrating the light-emitting device according to the first embodiment of the present invention;

FIG. 4 is a sectional view taken along line B-B in FIG. 3;

FIG. 5 is a sectional view taken along line C-C in FIG. 3;

FIG. 6 is a view illustrating a schematic circuit of the light-emitting device according to the first embodiment of the present invention;

FIG. 7 is a plan view illustrating a light-emitting device according to a second embodiment of the present invention; and FIG. 8 is a view illustrating a schematic circuit of the light-emitting device according to the second embodiment of the present invention.

BEST MODE

Hereinafter, embodiments of the present invention will be described in detail with reference to accompanying drawings.

It will be understood that when an element is referred to as being on/under a layer, it can be directly on/under, and one or more intervening elements may also be present. Although only an NPN type light emitting device will be described in the following embodiments, the embodiments of present invention are not limited thereto, but instead may also be applied to various types of light emitting device such as a PN type light emitting diode.

First Embodiment

FIGS. 2 through 6 illustrate a light-emitting device according to a first embodiment of the present invention.

FIG. 2 is a plan view illustrating the light-emitting device according to the first embodiment of the present invention and FIG. 3 is a perspective view illustrating the light-emitting device according to the first embodiment of the present invention.

Referring to FIGS. 2 and 3, a light-emitting device 300 and a protection device are formed on a substrate 310 with the same stacking structure.

Here, the protection device 400 may be separated from the light-emitting device 300 at one part of the light-emitting device 300. The substrate 310 may be an insulating substrate such as a sapphire substrate.

A passivation layer 390 may be formed in a boundary region 490 between the light-emitting device 300 and the protection device 400 to electrically separate them.

The light-emitting device 300 may be an NPN type light-emitting device. The protection device 400 protects the light-emitting device 300 using a voltage applied thereto in a reverse direction. The protection device 400 may also be an NPN type diode, for example. In other words, the light-emitting device 300 and the protection device 400 may have the identical NPN structure.

The light-emitting device 300 may be connected to a first semiconductor layer 420 of the protection device through a first connecting line 361. The protection device 400 may be connected to the first semiconductor layer 320 through a second connecting line 461.

The first and second connecting lines 361 and 461 may be metal layers. The first and second connecting lines 361 and 461 may be formed on ohm-forming layers 350 and 450, first semiconductor layers 320 and 420, and a passivation layer 390.

A first bonding pad 360 may be formed on the ohm-forming layer 350 of the light-emitting device at one side of the first connecting line 361. A second bonding pad 460 may be formed on the ohm-forming layer 450 of the protection device at one side of the second connecting line 461.

The ohm-forming layers 350 and 450 may be transparent electrodes.

According to the first embodiment of the present invention, because a second pad 460 is formed on a protection device 400, it is possible to secure a light-emitting region of the light-emitting device as large as the second bonding pad 460 and to prevent a light efficiency reduction in the light-emitting device with an ESD protection.

A structure of the light-emitting device with a protection device will be described in more detail with reference to FIGS. 3 to 6.

FIG. 3 is a perspective view illustrating the light-emitting device according to the first embodiment of the present invention. FIG. 4 is a sectional view taken along line B-B in FIG. 3, and FIG. 5 is a sectional view taken along line C-C in FIG. 3. FIG. 6 is a view illustrating a schematic circuit of the light-emitting device according to the first embodiment of the present invention.

A light-emitting device 300 and a protection device 400 may include first semiconductor layers 320 and 420, active layers 330 and 430, second semiconductor layers 340 and 440, third semiconductor layers 345 and 445, and ohm-forming layers 350 and 450, formed on a substrate 310.

The first semiconductor layers 320 and 420 formed on the substrate 310 may be n-GaN layers. The active layers 330 and 430 formed on the first semiconductor layers 320 and 420 may include InGaN-QW (quantum well). The second semiconductor layers 340 and 440 formed on the active layers may be p-GaN layers. The third semiconductor layers 345 and 445 formed on the second semiconductor layers 340 and 440 may be n-GaN layers.

The ohm-forming layers 350 and 450 may be formed on the third semiconductor layers 345 and 445. Here, the ohm-forming layers may be transparent oxide layers and may be at least one of ITO, ZnOx, Al doped ZnOx, RuOx, TiOx, IrOx and the like.

The first, second and third semiconductor layers 320, 340 and 345 of the light-emitting device and the first, second and third semiconductor layers 420, 440 and 445 of the protection device may be grown using a process of metal organic chemical vapor deposition (MOCVD) and the like. A buffer layer (not shown) such as AlN/GaN may also be formed on an upper surface of the substrate 310 in order to improve lattice match between the first semiconductor layers 320 and 420 and the substrate. Here, the third semiconductor layers 345 and 445 are layers for ohmic contacts.

A boundary region 490 between the light-emitting device 300 and the protection device 400 may be etched such that a portion of an upper surface of the substrate is exposed and the light-emitting device and the protection device are electrically separated from each other. Also, in the vicinity of the boundary region, portions of the first conductive semiconductor layer 320 in the light-emitting device and the first conductive semiconductor layer 420 in the protection device may be exposed by the etching.

A passivation layer 390 may be formed on the boundary region 490 and a periphery thereof for insulation between the devices and between the layers on the different devices. The passivation layer 390 may be stacked over the boundary region 490, the upper surface of the substrate 310 in the vicinity of the boundary region 490, an exposed portion of the first semiconductor layer 420 and the ohm-forming layer 450 of the protection device 400, and an exposed portion of the first semiconductor layer 320 and the ohm-forming layer 350 of the light-emitting device 300.

A first and a second connecting line 361 and 461 may be formed to electrically connect the light-emitting device 300 with the protection device 400. The first connecting line 361 may be formed on the passivation layer 390, the ohm-forming layer 350 of the light-emitting device and the first semiconductor layer 420 of the protection device. At one side of the first connecting line 361, a first bonding pad 360 of a predetermined size and shape may be formed.

The second connecting line 461 may be formed of a metal layer on the ohm-forming layer 450 of the protection device, the passivation layer 390, and the first semiconductor layer 320 of the light-emitting device. At one side of the second connecting line 461, a second bonding pad 460 of a predetermined size and shape may be formed.

The first connecting line 361 or the first bonding pad 360 formed on the ohm-forming layer 350 of the light-emitting device is electrically connected to a third semiconductor layer 345 through the ohm-forming layer 350 of the light-emitting device. Likewise, the second connecting line 461 or the second bonding pad 460 formed on the ohm-forming layer 450 of the protection device is electrically connected to a third semiconductor layer 445 through the ohm-forming layer 450 of the protection device.

Accordingly, the first connecting line 361 is electrically connected to the first semiconductor layer 420 of the protection device and the third semiconductor layer 345 of the light-emitting device, which are n-GaN layers. Likewise, the second connecting line 461 is electrically connected to the first semiconductor layer 320 of the light-emitting device and the third semiconductor layer 445 of the protection device, which are n-GaN layers.

The first bonding pad 360 may be formed at one side of the first connecting line 361 on the light-emitting device 300, and the second bonding pad 460 may be formed at one side of the second connecting line 461 on the protection device. Accordingly, the first and second connecting lines 361 and 461 may be wire-bonded, through the first and second bonding pads 360 and 460, to the light-emitting device including the protection device. The first and second bonding pads 360 and 460 may be formed of metal layers together with the first and second connecting lines 361 and 461.

Referring to FIG. 6, the first connecting line 361 electrically connects the ohm-forming layer 350 of the light-emitting device with the first semiconductor layer 420 of the protection device. The first bonding pad 360 formed at a side of the first connecting line 361 serves as an anode (A) terminal of the light-emitting device.

The second connecting line 461 electrically connects the ohm-forming layer 450 of the protection device with the first semiconductor layer 320 of the light-emitting device.

The second bonding pad 460 formed at a side of the second connecting line 461 serves as a cathode (K) terminal of the light-emitting device.

Hereinafter, operations of the first embodiment will be described. Referring to FIGS. 4 to 6, the first and second bonding pads 360 and 460 may serve as an anode and a cathode, respectively. In this case, when a p-type carrier flows into the device from the outside, the third semiconductor layer 345 of the light-emitting device forms a reverse grading between the third semiconductor layer 345 and the second semiconductor layer 340 of the light-emitting device to serve as an electrode contact layer.

The light-emitting device 300 operates normally and can be driven at a low voltage. In this case, because an anode is connected to the first semiconductor layer 420 of the protection device to apply a reverse voltage, the device does not work. When a reverse voltage or a reverse voltage of ESD is applied to the light-emitting device 300 suddenly, the light-emitting device 300 does not work because a reverse voltage is applied thereto. In other words, because of the reverse voltage, the protection device 400 works to safely protect the light-emitting device 300.

The light-emitting device 300 according to the first embodiment of the present invention includes no bonding pad to be connected to the cathode. Accordingly, it is possible to increase the light-emitting device region by a size of the bonding pad 460 formed on the protection device.

In other words, only one bonding pad is formed in the light-emitting device region. Such a light-emitting device 300 with an ESD-protection characteristic can be used in an ultra-thin high brightness package product which a diode cannot be mounted on and a package product which a protection device is needed to be mounted on.

According to another embodiment of the present invention, first and second bonding pads may be realized in a different structure from that of the first embodiment. For example, the first bonding pad may be formed on a first semiconductor of a light-emitting device, and the second bonding pad may be formed on a first semiconductor layer of a protection device.
Second Embodiment FIG. 7 is a plan view illustrating a light-emitting device according to a second embodiment of the present invention. FIG. 8 is a view illustrating a schematic circuit of the light-emitting device according to the second embodiment of the present invention.

The second embodiment of the present invention illustrates a structure where two bonding pads are formed in a protection device. The characteristics of the first embodiment can be applied thereto.

For example, the light-emitting device according to the second embodiment of the present invention may have the same stacking structure as that of the first embodiment.

The only difference of the second embodiment is that two bonding pads are formed in a protection device 400.

Referring to FIGS. 7 and 8, a first bonding pad 470a may be formed in one part of a region 500 including a protection device 400, and a second bonding pad 460a may be formed in another part of the region. For example, the first bonding pad 470a may be formed on an ohm-forming layer 450 of the protection device, and the second bonding pad 460a may be formed on a first conductive semiconductor layer 420 of the protection device.

The first and second bonding pads 470a and 460a may be formed to have the identical size or different sizes, and may be electrically connected to the light-emitting device 300 through a first connecting line 361 and a second connecting line 461.

For example, the first connecting line 361 is formed on the first semiconductor layer 420 of the protection device 400 and an ohm-forming layer 350 of the light-emitting device 300, to electrically interconnect the first semiconductor layer 420 of the protection device 400 and the third semiconductor layer 345 of the light-emitting device 300. The first bonding pad 470a formed at one side of the first connecting line 361 in the protection device region serves as an anode (A) terminal.

The second connecting line 461 is formed on an ohm-forming layer of the protection device 400 and a first semiconductor layer 320 of the light-emitting device 300, to electrically interconnect the third semiconductor layer 445 of the protection device and the first semiconductor layer 320 of the light-emitting device. The second bonding pad 460a formed at one side of the second connecting line 461 in the protection device region serves as a cathode (K) terminal.

As described above, according to the second embodiment of the present invention, two bonding pads 460a and 470a are formed in an ESD-protection device 400, and both electrodes of the protection device 400 and the light-emitting device 300 are interconnected in a circuit, respectively. Accordingly, a light-emitting device with a protection device is formed to operate.

According to the second embodiment of the present invention, because a bonding pad is formed on a protection device instead of a light-emitting device, it is possible to increase a light-emitting region.

Furthermore, according to the second embodiment of the present invention, because a bonding pad is formed on a protection device instead of a light-emitting device, an additional bonding pad region except the protection device region is not required.

While the present invention has been described and illustrated herein with reference to the preferred embodiments thereof, it will be apparent to those skilled in the art that various modifications and variations can be made therein without departing from the spirit and scope of the invention. Thus, it is intended that the present invention covers the modifications and variations of this invention that come within the scope of the appended claims and their equivalents.

The invention claimed is:

1. The light-emitting apparatus, comprising:
a substrate;
a light-emitting device on one part of the substrate and including a first semiconductor layer, a first active layer, a second semiconductor layer, and a first ohmic layer on the second semiconductor layer;
a protection device on another part of the substrate and including a fourth semiconductor layer, a second active layer, a fifth semiconductor layer, and a second ohmic layer on the fifth semiconductor layer;
a connecting line for electrically connecting the light-emitting device with the protection device;
a first bonding pad on the second ohmic layer;
a second bonding pad on the fourth semiconductor layer; and
a passivation layer in a boundary region between the light-emitting device and the protection device,
wherein the first semiconductor layer and the fourth semiconductor layer are first conductive type semiconductor layers, and the second semiconductor layer and the fifth semiconductor layer are second conductive type semiconductor layers,
wherein the connecting line includes:
a first connecting line on the fourth semiconductor layer, the passivation layer, and the first ohmic layer; and
a second connecting line on the second ohmic layer, the passivation layer and the first semiconductor layer,
wherein the light-emitting apparatus does not include a bonding pad on the light-emitting device,
wherein the light-emitting device comprises a third semiconductor layer on the second semiconductor layer, and the protection device comprises a sixth semiconductor layer on the fifth semiconductor layer, and
wherein the third semiconductor layer and the sixth semiconductor layer are the first conductive type semiconductor layers same as the first semiconductor layer and the fourth semiconductor layer.

2. The light-emitting apparatus according to claim 1,
wherein the first ohmic layer is on the third semiconductor layer, and
wherein the second ohmic layer is on the sixth semiconductor layer.

3. The light-emitting apparatus according to claim 1,
wherein the first connecting line is directly disposed on both the fourth semiconductor layer and the first ohmic layer, and
the second connecting line is directly disposed on both the second ohmic layer and the first semiconductor layer.

* * * * *